United States Patent
Perry et al.

(10) Patent No.: US 8,365,109 B1
(45) Date of Patent: Jan. 29, 2013

(54) DETERMINING EFFICIENT BUFFERING FOR MULTI-DIMENSIONAL DATASTREAM APPLICATIONS

(75) Inventors: Thomas P. Perry, Edinburgh (GB); Richard L. Walke, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/535,123

(22) Filed: Jun. 27, 2012

(51) Int. Cl.
*G06F 17/50* (2006.01)
(52) U.S. Cl. ......... 716/102; 716/101; 716/114; 716/139
(58) Field of Classification Search .................. 716/101, 716/102, 114, 139
See application file for complete search history.

(56) References Cited

U.S. PATENT DOCUMENTS

| | | | | |
|---|---|---|---|---|
| 5,799,064 | A * | 8/1998 | Sridhar et al. | 379/93.06 |
| 6,131,182 | A * | 10/2000 | Beakes et al. | 716/105 |
| 6,698,002 | B2 * | 2/2004 | Chang et al. | 716/106 |
| 7,210,111 | B1 * | 4/2007 | Smith et al. | 716/108 |
| 7,333,514 | B2 * | 2/2008 | Anehem et al. | 370/474 |
| 2005/0289495 | A1 * | 12/2005 | Raghunandran | 716/11 |
| 2010/0235803 | A1 * | 9/2010 | Gramark et al. | 716/12 |

OTHER PUBLICATIONS

"Bridge Over Troubled Wrappers: Automated Interface Synthesis", by ViJay D'silva, S. Ramesh, Arcot Sowmya, @2004, IEEE.*
"A Formal Approach to Interface Synthesis for System-On-Chip Design", by Vijay D'silva, Arcot Sowmya, Sridevan Parameswaran, S. Ramesh, Apr. 2003.*
Murthy, Praveen K., et al., "Multidimensional Synchronous Dataflow", IEEE Transactions on signal Processing, vol. 50, No. 7, Jul. 2002, pp. 2064-2079.

* cited by examiner

*Primary Examiner* — Thuan Do
*Assistant Examiner* — Nha Nguyen
(74) *Attorney, Agent, or Firm* — LeRoy D. Maunu; Lois D. Cartier

(57) ABSTRACT

In one embodiment, a method of generating a circuit design is provided. For each data terminal connecting a plurality of components in a circuit design, a respective list of dimensions of data used by the data terminal are determined. A plurality of exchange orderings are generated that each indicate an order in which dimensions are exchanged between the lists. For each exchange ordering, dimensions are exchanged between the lists according to the exchange ordering to produce a set of supplemented lists of dimensions. A set of buffers for buffering data between the data terminals are determined based on the supplemented lists of dimensions. Memory requirements are determined for each of the set of buffers. The circuit design is modified to include the one of the determined sets of buffers having a lowest memory requirement.

17 Claims, 14 Drawing Sheets

DETERMINING EFFICIENT BUFFERING FOR MULTI-DIMENSIONAL DATASTREAM APPLICATIONS

FIELD OF THE INVENTION

One or more embodiments generally relate to inter-circuit communication.

BACKGROUND

Complex integrated circuits (ICs) can be designed using various levels of abstraction. Using a hardware description language (HDL), circuits can be designed at the gate level, the register transfer level (RTL), and higher logical levels. When designing using an HDL, the designer describes the behavior of a system in terms of signals that are generated and propagated from one set of registers to another set of registers through combinatorial logic modules. HDLs provide a rich set of constructs to describe the functionality of each module. Modules may be combined and augmented to form even higher-level modules.

System-level integration may rely on reuse of previously created designs that have been provided either from within an enterprise or from a commercial provider. Libraries of pre-developed blocks of logic have been developed that can be selected and included in a circuit design. Such logic blocks include, for example, adders, multipliers, filters, and other arithmetic and digital signal processing (DSP) functions from which system designs can be readily constructed. The logic blocks may further include memories and storage elements. The engineering community sometimes refers to these previously created logic blocks as "design modules," "cores," "IP cores" (intellectual property cores), or "logic cores," and such terms may be used interchangeably herein. The use of pre-developed IP cores permits faster design cycles by eliminating the redesign of circuits. Thus, using IP cores from a library may reduce design costs. Such IP cores may often be available for purchase by parties who desire the functionality provided by the IP core. IP cores include a circuit design in the form of source code or a netlist that may be used in implementing the design in a programmable IC, such as a field programmable gate array (FPGA). The core may be integrated into a design by instantiating the code or netlist. The logic core is then placed and routed along with the rest of the design to provide the desired functionality.

Incorporation of a logic core into a larger design, however, may not be a simple task. For example, different IP cores included in a signal processing design may be configured to operate on different dimensions of a data stream. For instance, in some communication systems, data may be received as codewords over a number of antennas, over a number of channel frequency bands, and/or over a number of time slots, etc. A first component of the signal processing design may be configured to output data as a set of codewords, whereas a next component of the signal processing design may be configured to receive data in the frequency domain as a set of subcarriers.

Due to the mismatch between the components, the components may not be able to be connected together directly without reformatting the data. To accommodate the mismatch in formats between the two components, sets of codewords may be buffered until complete sets of sub-carriers are obtained for input to the second component. Manual implementation of such buffers to perform such reformatting can be an error prone and time-consuming process. Further, such manual implementation requires designers to possess a requisite knowledge of data format requirements of each of the components in the signal processing design, which may be cumbersome to obtain.

SUMMARY

In one embodiment, a method of generating a circuit design is provided. A circuit design having a plurality of components is received. Each component in the plurality of components has a data terminal connected to a data terminal of another one of the components. For each of the data terminals, a respective list of dimensions of data used by the data terminal are determined. Using at least one programmed processor, a plurality of exchange orderings are generated. Each exchange ordering indicates an order in which dimensions are exchanged between the lists. For each exchange ordering, dimensions are exchanged between the lists in the order indicated by the exchange ordering to produce a set of supplemented lists of dimensions. A set of buffers for buffering data between connected ones of the data terminals are determined based on the supplemented lists of dimensions. Memory requirements are determined for each of the set of buffers corresponding to each exchange ordering. Using the at least one programmed processor, the circuit design is modified to include the one of the determined sets of buffers having a lowest memory requirement.

In another embodiment, a method is provided. A specification having a plurality of components is received. Each of the plurality of components has a data terminal connected to a data terminal of another one of the components. For each of the data terminals, a respective list of dimensions of data used by the data terminal is determined. Using at least one programmed processor, a plurality of propagation scenarios are generated. Each propagation scenario indicates a set of supplemented lists resulting from a respective exchange of dimensions between the lists of dimensions such that each supplemented list in the set includes every dimension included in the lists of dimensions. The respective exchange of dimensions for each propagation scenario has a different order than the exchanges of scenarios corresponding to other ones of the plurality of propagation scenarios. For each propagation scenario, a respective set of buffers for buffering data between connected ones of the data terminals are determined based on the corresponding supplemented list of dimensions. Memory requirements are determined for each of the set of buffers corresponding to each exchange ordering. Using the at least one programmed processor, the specification is modified to include the one of the determined sets of buffers having a lowest memory requirement.

In yet another embodiment, a system is provided. The system includes a plurality of components, each having a respective list of dimensions indicating dimensions of a data stream utilized by the component. The plurality includes a first component that having a first data terminal and a second component that having a second data terminal. The system also includes at least one buffer coupled to the first data terminal and the second data terminals and configured to buffer the data stream transmitted between the first and second components. The at least one buffer is characterized by a memory requirement that is determined based on supplemental lists of dimensions that are generated by exchanging dimensions between the plurality of the lists of dimensions to supplement the first and second lists of dimensions.

It will be appreciated that various other embodiments are set forth in the Detailed Description and Claims, which follow.

BRIEF DESCRIPTION OF THE DRAWINGS

Various aspects and advantages of one or more embodiments will become apparent upon review of the following detailed description and upon reference to the drawings in which:

FIGS. 5-1 through 5-4 illustrate exchange of dimensions between components in a first order using the process shown in FIG. 3 to generate a first buffer solution;

FIGS. 6-1 through 6-4 illustrate exchange of dimensions between components in a second order using the process shown in FIG. 3 to generate a second buffer solution;

FIGS. 8-1 through 8-4 illustrate exchange of dimensions between components in a first order using the process shown in FIG. 7 to generate a first buffer solution;

FIGS. 9-1 through 9-4 illustrate exchange of dimensions between components in a second order using the process shown in FIG. 7 to generate a second buffer solution;

DETAILED DESCRIPTION

Connecting various components in a circuit design can be a complex task. For example, different IP cores included in a signal processing design may be configured to process different dimensions of a data stream. To accommodate the mismatch of dimensions of data utilized by different components, a data stream output from a first component may be required to be buffered to make a required dimension of a data stream available for further processing by a second component. Manual implementation of such buffers to perform such reformatting can be error prone and time-consuming. For instance, manual implementation of buffers for reformatting a data stream requires knowledge of data format requirements of each of the components in the signal processing design. However, such documentation may not be readily available or include the necessary format requirements. Furthermore, utilized dimensions of a data stream may not be defined for some customized components in a circuit design. In one or more embodiments, type information associated with component interfaces is collectively used to infer dimensions of data and desirable buffer sizes.

In one or more embodiments, buffer circuits are automatically generated and added to a circuit design based on dimensions of a data stream used by each of the interconnected components. For each data terminal that connects two interconnected components, a list of required dimensions is determined. Dimensions are exchanged between the lists of dimensions of the interconnected components to produce supplemented lists. The supplemented lists each include all dimensions used by the interconnected components. As discussed in more detail below, dimensions of data needed to be buffered between connected components can be determined based on the order in which dimensions appear in the lists of dimensions.

The order in which dimensions appear in the supplemented lists may be affected by the order in which dimensions are exchanged. As such, depending on the ordering in which dimensions are exchanged between the components, different sets of dimensions for the buffers may be identified. Accordingly, several different sets of buffers may each be sufficient to reformat a data stream for a set of components operating on different dimensions of a data stream. However, the different sets of buffers may have different memory resource requirements for implementation. The number of these different possible sets of buffer arrangements may prohibit manual analysis of memory requirements of the different solutions. In one or more embodiments, a plurality of different buffer arrangements are generated and analyzed to determine memory resource requirements of each solution. For ease of reference, each of the different sets of buffers may be referred to as a buffer solution. Code is generated and added to the design to implement the buffer solution requiring the least amount of memory resources.

Figure 1:
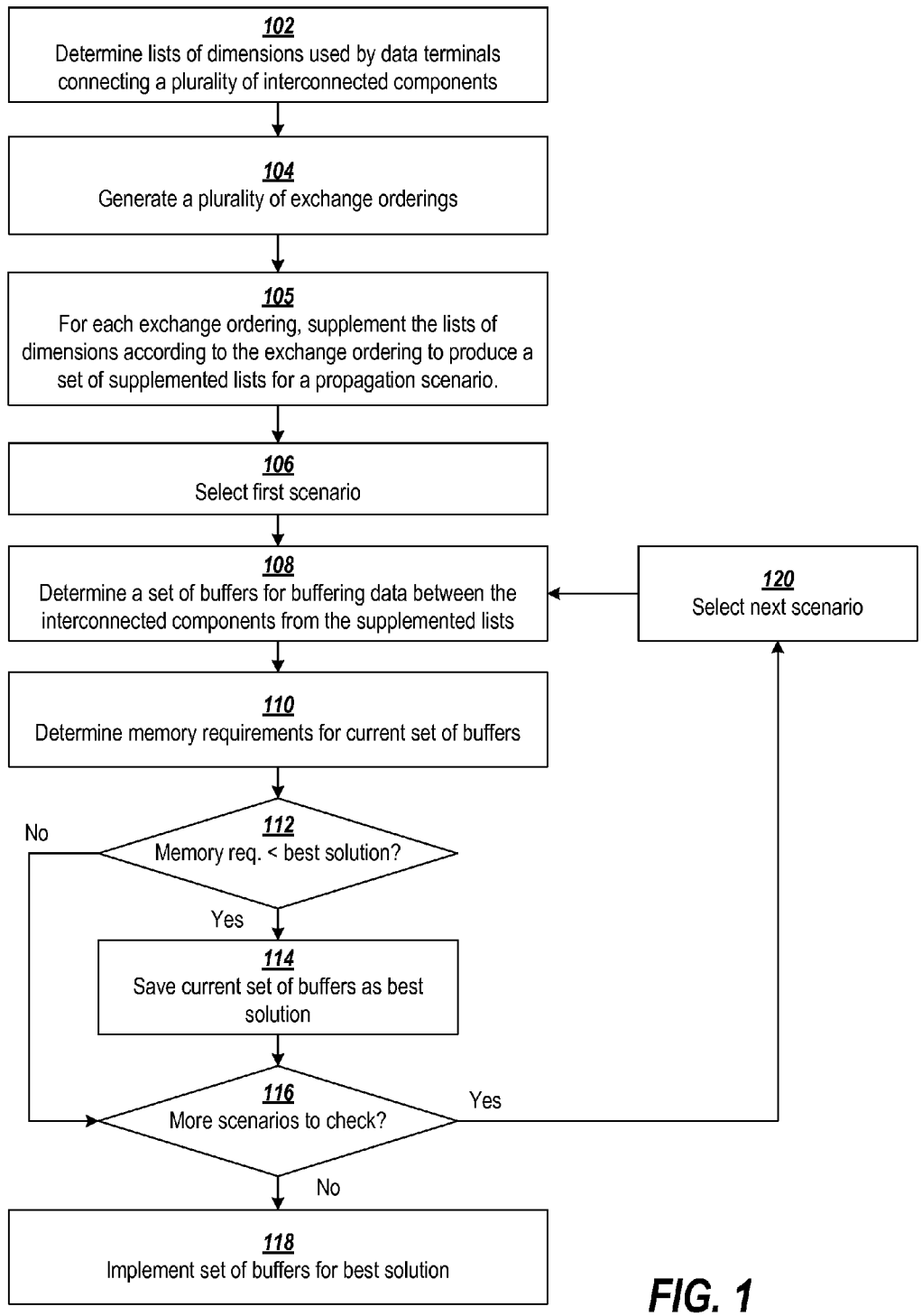
FIG. 1 shows a flowchart of an automated process for generating a set of buffers for data format conversion, in accordance with one or more embodiments.

FIG. 1 shows a flowchart of an example method for determining memory-efficient buffers for reformatting a data stream between components operating on different dimensions of a data stream. The process determines a plurality of buffer solutions. Based on memory requirements of the plurality of buffer solutions, a set of memory efficient buffers is determined.

For each of a plurality of interconnected components, a list of dimensions of a data stream used by data terminals connecting the interconnected components is determined at block 102. As indicated above, different buffer solutions may be generated by exchanging dimensions between components in different respective orders. For ease of reference, each different ordering in which dimensions can be exchanged between lists may be referred to as an exchange ordering. When dimensions are exchanged between lists according to an exchange ordering, each list of dimensions is fully supplemented to include each dimension of a data stream used by the plurality of interconnected components. For ease of reference, the fully supplemented lists may be referred to as a propagation scenario and such terms are used interchangeably herein.

A plurality of exchange orderings are generated at block 104. For each exchange ordering, dimensions are exchanged between the lists of dimensions according to the exchange ordering at block 105 to produce supplemented lists for a respective propagation scenario. As explained in more detail with respect to FIGS. 3 and 7, dimensions may be exchanged between the lists of dimensions using a number of different processes.

A first one of the propagation scenarios is selected at block 106. Using the supplemented lists of dimensions in the selected propagation scenario, a set of buffers for buffering data between the interconnected components is determined at block 108. Memory resource requirements of the set of buffers are determined at block 110. If the determined memory resource requirements are less than the best solution at decision block 112, the current set of buffers is saved as the best solution at block 114. While there are more propagation scenarios to check as determined at decision block 116, the next scenario is selected at block 120, and a buffer solution is determined as described above. After all scenarios have been checked at decision block 116, code may be generated at block 118 to implement the set of buffers having the least memory requirements (i.e., the set of buffers saved as the best solution).

Figure 2:
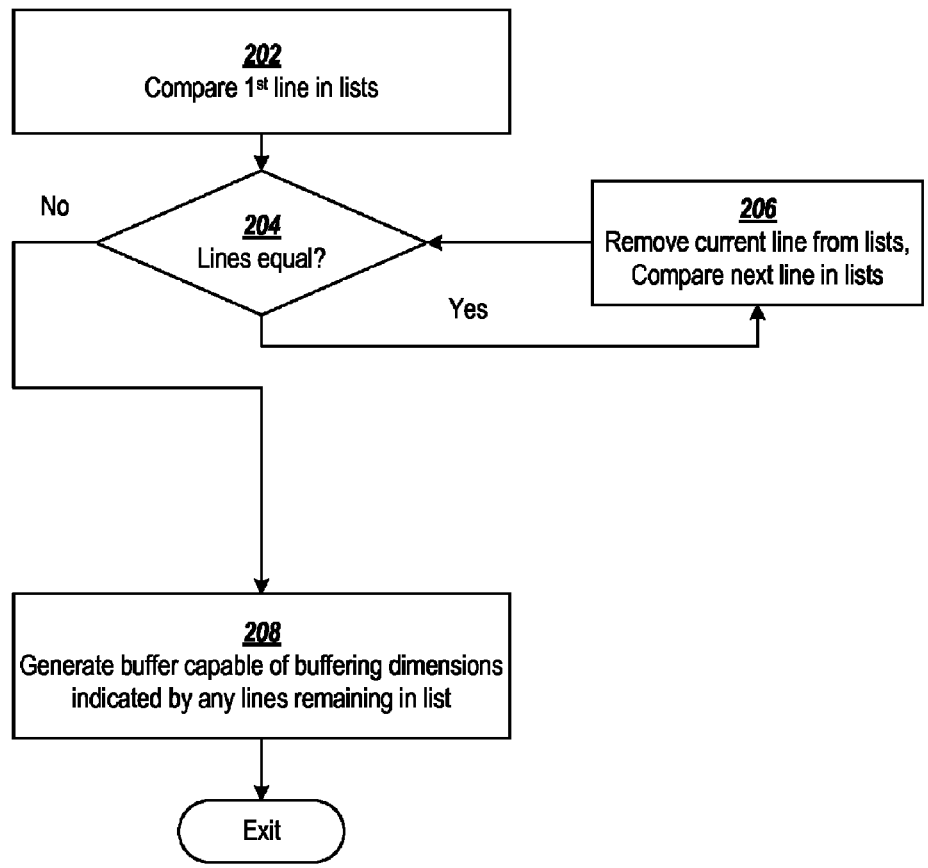
FIG. 2 shows a flowchart of a process for determining required dimensions for buffering data between two components, in accordance with one or more embodiments.

FIG. 2 shows a flowchart of an example process for determining required dimensions for buffering between two components based on the supplemented lists of dimensions of a propagation scenario. In one or more embodiments, the process may be used to determine a set of buffers in block 108 of FIG. 1. As indicated above, the order in which dimensions appear in the supplemented lists of two connected components (for a propagation scenario) indicates which dimensions of the data stream are required to be buffered. The process shown in FIG. 2 assumes that a list of dimensions are supplemented by adding new dimensions to the top of the list. Under such constraints, a dimension located at the top of both lists is not required to be buffered.

The first line in a first supplemented list of a propagation scenario is compared to a first line of the second list of the propagation scenario at block 202. If the compared lines indicate the same dimension as determined at decision block 204, the line is removed from each of the lists and the next line in the two lists are compared at block 206. If the compared lines indicated different dimensions as determined at decision block 204, each remaining dimension indicated by the lists must be buffered. At block 208, a buffer is generated that is capable of buffering dimensions of the data stream indicated by lines remaining in the lists.

Although the process shown in FIG. 2 assumes that the lists of dimensions are supplemented by adding new dimensions to the top of the list, the embodiments are not so limited. For instance, it is recognized that the processes may be configured to process the lists of dimensions having dimensions arranged in reverse format (e.g. supplemented by adding dimensions to the bottom of the list).

Figure 3:
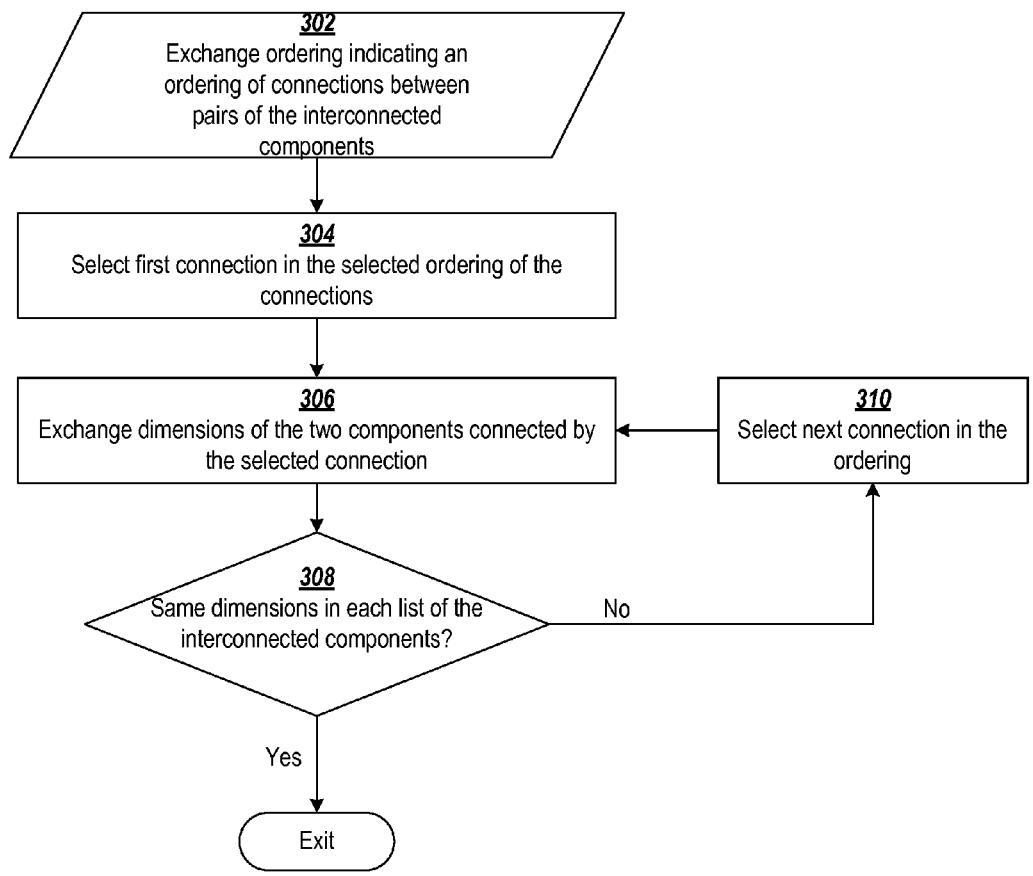
FIG. 3 shows a flowchart of a process for exchanging dimensional data to produce supplemental lists of dimensions used in the process shown in FIG. 2.

FIG. 3 shows a flowchart of a process for exchanging dimensional data between lists of dimensions to produce supplemental lists of dimensions for one propagation scenario. In this example process, an input exchange ordering 302 indicates an ordering of connections between multiple interconnected components. For ease of reference an ordering of connections may be referred to as a connection ordering. A first one of the connections indicated by the ordering of the scenario 302 is selected at block 304. Dimensions are exchanged between dimension lists of two components connected by the connection at block 306. The exchange of dimensions may be performed by supplementing each respective list with dimensions included in the other. For instance, if a dimension is indicated by a first one of the two lists but not the second list, the dimension is added to the second list. Dimensions from a first list are added to another list in the same order that the dimensions appear in the first list. The next connection in the connection ordering is selected at block 310 and dimension exchange is repeated at block 306 until the same set of dimensions are indicated in each of the supplemented lists at decision block 308.

Figure 4:
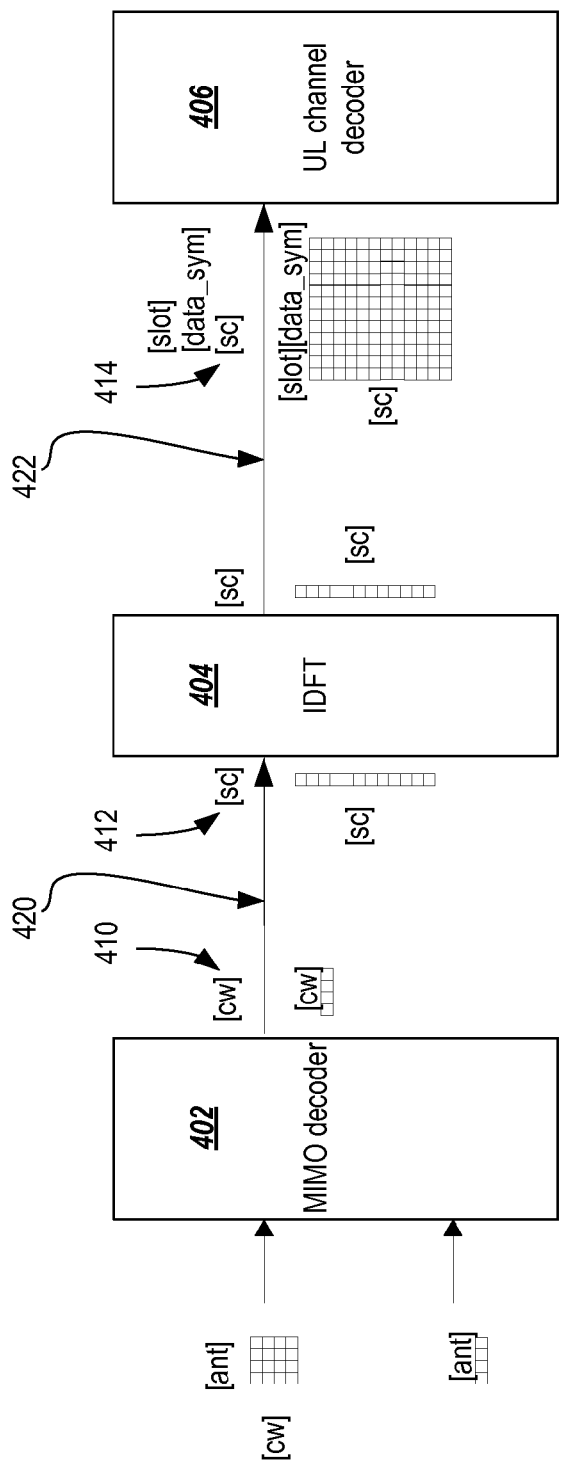
FIG. 4 shows a block diagram of part of the physical layer of an LTE system that requires data format to be converted between the interconnected components.

The exchange of dimensions between the lists of dimensions and the generation of different buffer solutions may be explained by way of example. FIG. 4 shows a block diagram of part of the physical layer of an LTE system having a series of interconnected components that operate on different dimensions of a data stream. The interconnected components include a MIMO decoder 402, an inverse discrete Fourier transform (IDFT) 404, and a UL channel decoder 406. In the LTE system, the MIMO decoder 402 identifies senders (associated with different codewords) using samples received from multiple receive antennas. The MIMO decoder 402 is able to process one resource element at a time, where a resource element is a data sample at a particular frequency and time. For each resource element, it takes a small channel matrix having codeword [cw] and antenna [ant] dimensions, as well as a sample of data across the antennas [ant] to generate an output for a number of codewords [cw]. This data is then processed by the IDFT 404. However, the IDFT is applied across a group of subcarriers [sc] for a single codeword. Due to the mismatch between the dimensions of a data stream operated on by the components 402 and 404, a buffer is required to allow the data stream to be reformatted. Similar mismatch between dimensions of the data stream occurs between the IDFT component 404 and the UL channel decoder 406, which is connected to the output of the IDFT 404. In this example, the UL channel decoder 406 operates on a data block including a number of time domain slots [slot], which each include a number of data symbols [data_sym], across a number of subcarriers [sc]. Each of the components 402, 404, and 406 has a respective list of dimensions 410, 412, and 414 used by data terminals that interconnect the components. For ease of illustration and explanation regarding exchange of dimensions between lists, the list of dimensions 414 for component 404 is illustrated separately for each of the two connections 420 and 422.

Figures 1, 5:
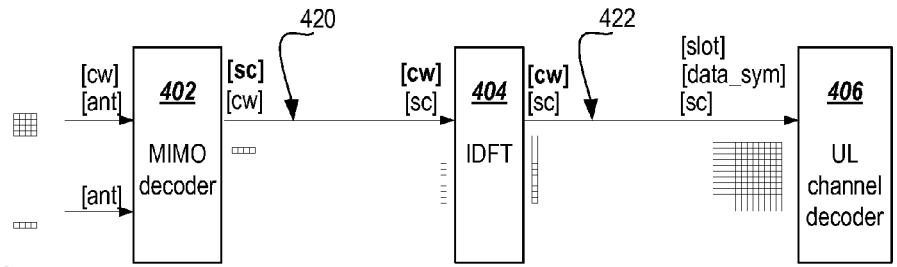
Figures 2, 5:
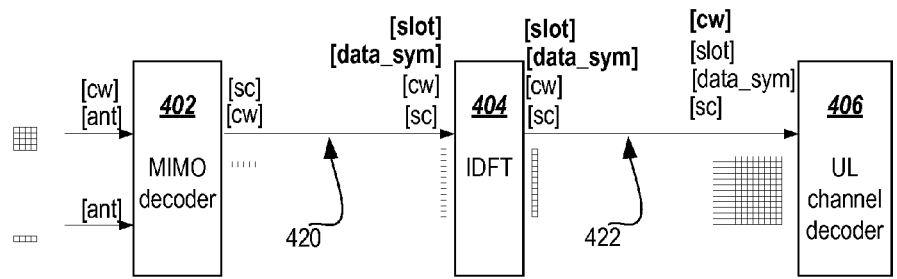
Figures 3, 5:
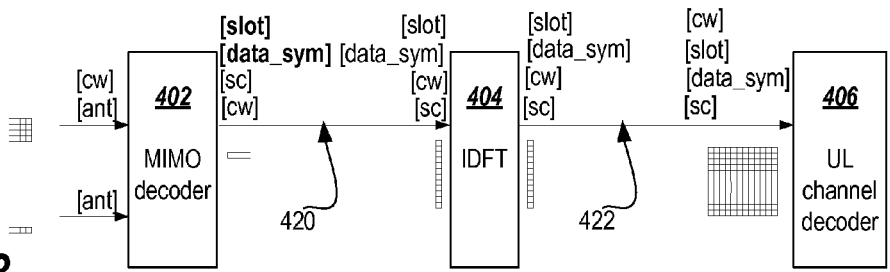
Figures 4, 5:
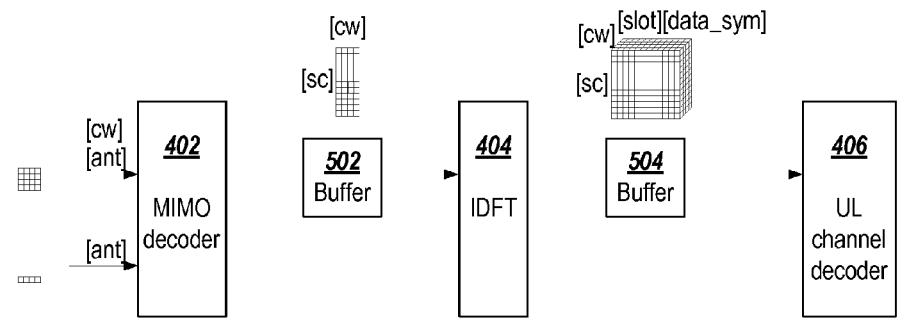

FIGS. 5-1 through 5-4 illustrate exchange of dimensions between lists of dimensions for components shown in FIG. 4, and the exchange of dimensions is in a first connection order using the process shown in FIG. 3 to generate a first buffer solution. In this example, dimensions are exchanged across connections in the order of {420, 422}, which is repeated until each of the lists of dimensions contain the same dimensions. FIGS. 5-1 illustrates an exchange of dimensions between lists of dimensions of components 402 and 404 for a first selected connection 420 of the ordering {420, 422}. As a result of the exchange, the list of component 402 is supplemented with dimension [sc] and the list of component 404 is supplemented with dimension [cw] (supplemented dimensions are indicated in bold). For ease of explanation and illustration, supplementation of dimensions of inputs to MIMO decoder 402 are not shown in FIGS. 5-1 through 5-4. After the exchange in FIGS. 5-1, the three lists 410, 412, and 414 include different dimensions. As such, exchanging of dimensions continues as described in connection with FIG. 3.

FIGS. 5-2 illustrates an exchange of dimensions between lists of dimensions of components 404 and 406 for a second selected connection 422 of the ordering {420, 422}. As a result of the exchange, the list of component 404 is supplemented with dimensions [slot] and [data_sym] and the list of component 406 is supplemented with dimension [cw]. After the exchange in FIGS. 5-2, the three lists 410, 412, and 414 still include different dimensions, so exchanging of dimensions continues with the connection ordering {420, 422} restarted.

FIGS. 5-3 illustrates an exchange of dimensions between lists of dimensions of components 402 and 404 for the first selected connection 420 of the ordering {420, 422}. As a result of the exchange, the list of component 402 is supplemented with dimensions [slot] and [data_sym] and all of the supplemented lists include the same dimensions. Therefore, as indicated in FIG. 3, exchanging of dimensions for the connection ordering {420, 422} is completed.

FIGS. 5-4 illustrates generation of a set of buffers (i.e. a buffer solution) for the propagation scenario resulting from connection ordering {420, 422} based on the supplemented lists of dimensions shown in FIGS. 5-3. As described with reference to FIG. 2, matching dimensions located at the top of both lists are not required to be buffered. For connection 420, the lists of connected components 402 and 404 both include dimensions [slot] and [data_sym] in the same location at the top of the list. As such, only dimensions [sc] and [cw] are required to be buffered in buffer 502. For connection 422, each of the dimensions must be buffered in buffer 504 because the first line in the lists of connected components 404 and 406 do not match.

Figures 1, 6:
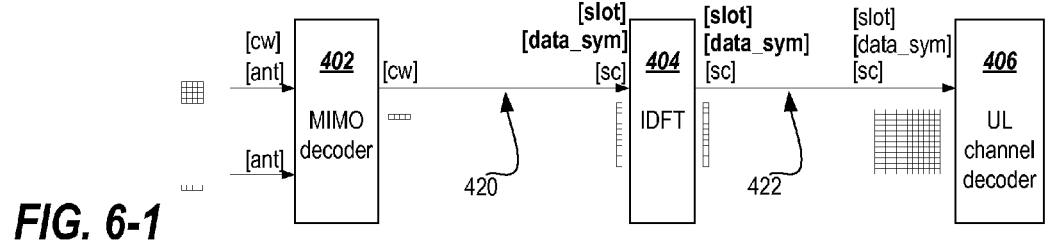
Figures 2, 6:
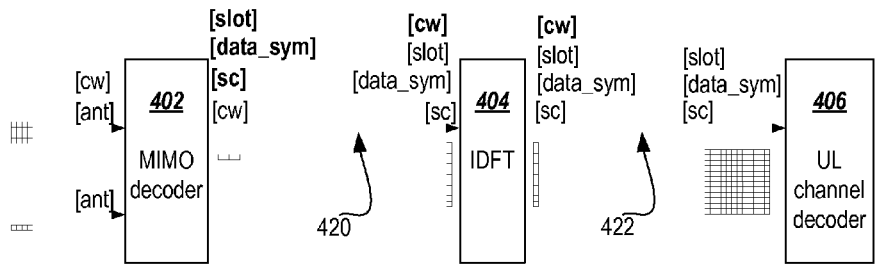
Figures 3, 6:
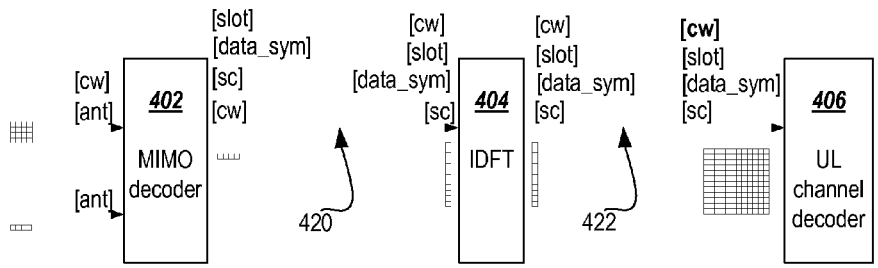
Figures 4, 6:
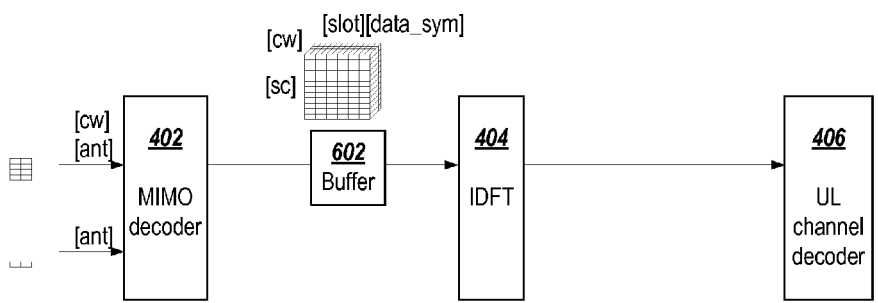

As briefly indicated above, the buffer solutions generated may depend on the order in which dimensions are exchanged between lists for the different scenarios. FIGS. 6-1 through 6-4 illustrate exchange of dimensions between lists of dimensions, for components shown in FIG. 4, in a second order using the process shown in FIG. 3 to generate a second buffer solution. In this example, dimensions are exchanged across connections in the connection ordering {422, 420}, which is repeated until each of the lists of dimensions contain the same dimensions. FIGS. 6-1 illustrates an exchange of dimensions between lists of dimensions of components 404 and 406 for the first connection 422 of the ordering {422, 420}. As a result of the exchange, the list of dimensions for component 404 is supplemented with dimensions [slot] and [data_sym]. For ease of explanation and illustration, supplementation of dimensions of inputs to MIMO decoder 402 are not shown in FIGS. 6-1 through 6-4. After the exchange in FIGS. 6-1, the three lists 410, 412, and 414 include different dimensions. As such, exchanging of dimensions continues as described in connection with FIG. 3.

FIGS. 6-2 illustrates an exchange of dimensions between lists of dimensions of components 402 and 404 for a second selected connection 420 of the connection ordering {422, 420}. As a result of the exchange, the list of dimensions for component 402 is supplemented with dimensions [slot], [data_sym], and [sc] and the list of component 404 is supplemented with dimension [cw]. After the exchange in FIGS. 6-2, the three lists 410, 412, and 414 still include different dimensions, so exchanging of dimensions continues with the connection ordering {422, 420} restarted.

FIGS. 6-3 illustrates an exchange of dimensions between lists of dimensions of components 404 and 406 for the first selected connection 422 of the connection ordering {422, 420}. As a result of the exchange, the list of dimensions for component 406 is supplemented with dimensions [cw] and all of the supplemented lists include the same dimensions. Therefore, as indicated in FIG. 3, exchanging of dimensions for the connection ordering {420, 422} is completed.

FIGS. 6-4 illustrates generation of a set of buffers (i.e. a buffer solution) for the scenario order resulting from the connection ordering {422, 420} based on the supplemented lists of dimensions shown in FIGS. 6-3. As described with reference to FIG. 2, dimensions located at the top of both lists are not required to be buffered. For connection 420, each of the dimensions must be buffered in buffer 602 because the first line in the lists of connected components 402 and 404 do not match. For connection 422, none of the dimensions need to be buffered because each of the lines in the lists of components 404 and 406 match.

In comparison between the buffer solutions shown in FIGS. 5-4 and FIG. 6-4, it can be seen that buffer 504 requires the same amount of memory resources as buffer 602. However, the buffer solution of FIGS. 5-4 also requires memory resources to implement buffer 502. Therefore, the buffer solution generated in FIGS. 6-2 as a result of the connection ordering {422, 420} is the more optimal buffer solution.

Figure 7:
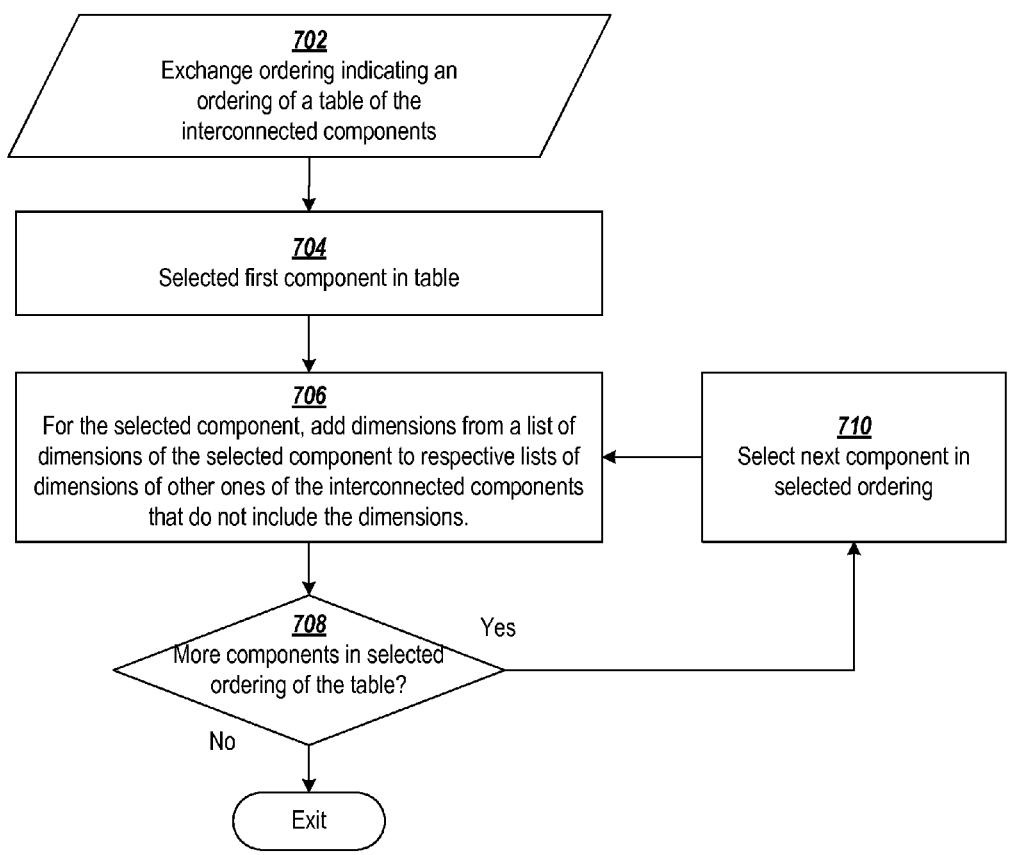
FIG. 7 shows a flowchart of another process for exchanging dimensional data to produce supplemental lists of dimensions used in the process shown in FIG. 2.

FIG. 7 shows a flowchart of another process for exchanging dimensions to produce the supplemental lists of dimensions for a particular order indicated by an exchange ordering. In this example process, an input exchange ordering 702 indicates an order of a table of the interconnected components. For ease of reference, an ordering of the interconnected components may be referred to as a component ordering. A first one of the components indicated by the component ordering 702 is selected at block 704. Dimensions from a list of dimensions of the selected component are used to supplement lists of dimensions for other components at block 706. For instance, a dimension in a selected list is added to one of the other list of dimensions if the dimension is not included in the other list of dimensions. Dimensions added from a first list to a second list are added in the same order that the dimensions appear in the first list. The next component in the component ordering 702 is selected at block 710 and dimension exchange is repeated at block 706 until the same set of dimensions are indicated in each of the supplemented lists at decision block 708.

Figures 1, 8:
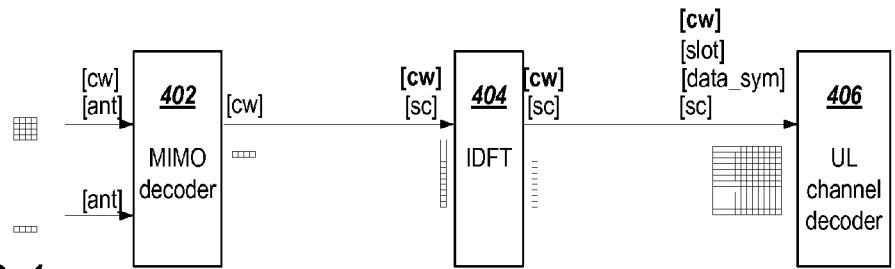
Figures 2, 8:
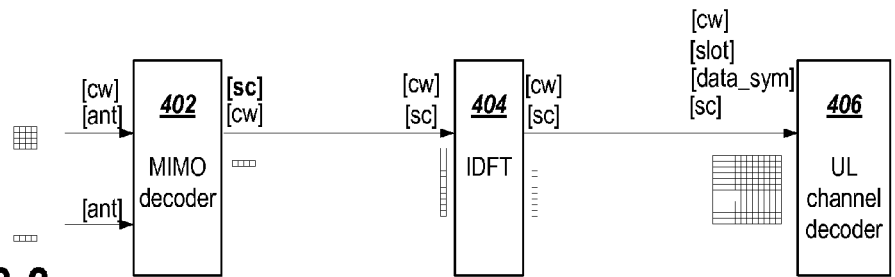
Figures 3, 8:
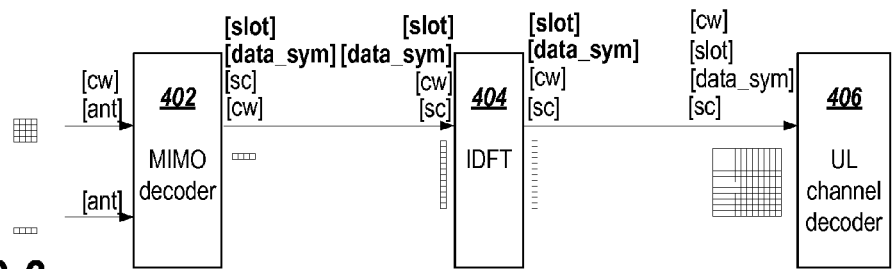
Figures 4, 8:
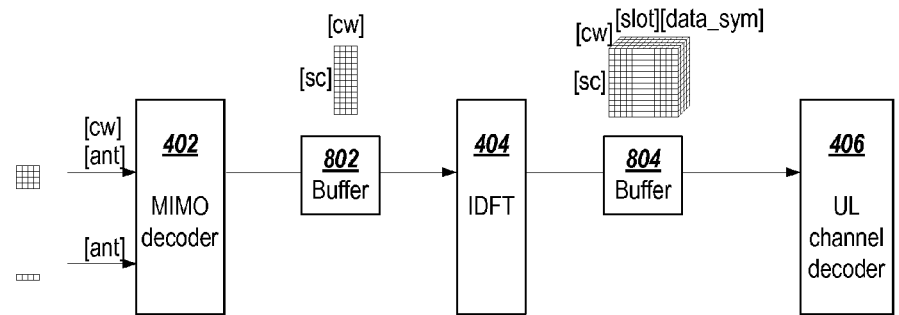

FIGS. 8-1 through 8-4 illustrate exchange of dimensions between the example components shown in FIG. 4 in a first component ordering using the process shown in FIG. 7 to generate a first buffer solution. In this example, dimensions are supplemented from lists of dimensions in the component ordering {402, 404, and 406}. This process only requires that dimensions be supplemented from each list once to produce the fully supplemented lists of a propagation scenario. For ease of explanation and illustration, supplementation of dimensions of inputs to MIMO decoder 402 are not shown in FIGS. 8-1 through 8-4.

FIGS. 8-1 illustrates supplementing dimensions from the list of dimensions for the first component 402 in the component ordering {402, 404, 406} to the lists of components 404 and 406. As a result, the lists of dimensions for components 404 and 406 are each supplemented with dimension [cw]. FIGS. 8-2 illustrates the supplementation of dimensions from the list of dimensions for the second component 404 in the ordering {402, 404, and 406}. As a result, the list of dimensions for component 402 is supplemented with dimension [sc]. FIGS. 8-3 illustrates the supplementation of dimensions from the list of dimensions for the last component 406 in the component ordering {402, 404, and 406}. As a result, the lists of components 402 and 404 are each supplemented with dimensions [slot] and [data_sym].

FIGS. 8-4 illustrates generation of a set of buffers (i.e. a buffer solution) for the propagation scenario resulting from the component ordering {402, 404, 406} shown in FIGS. 8-1 through 8-3 based on the supplemented lists of dimensions shown in FIG. 8-3. As described with reference to FIG. 2, dimensions located at the top of both lists are not required to be buffered. Similar to the solution shown in FIGS. 5-4, the lists of connected components 402 and 404 both include dimensions [slot] and [data_sym] in the same location at the top of the list. As such, only dimensions [sc] and [cw] are required to be buffered in buffer 802. For connection 422, each of the dimensions must be buffered in buffer 804 because the first line in the lists of connected components 404 and 406 do not match.

Figures 1, 9:
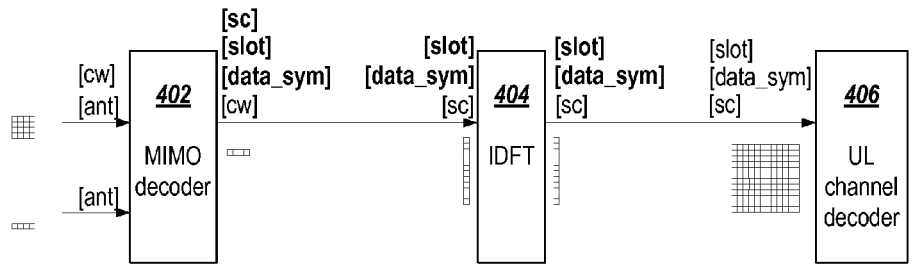
Figures 2, 9:
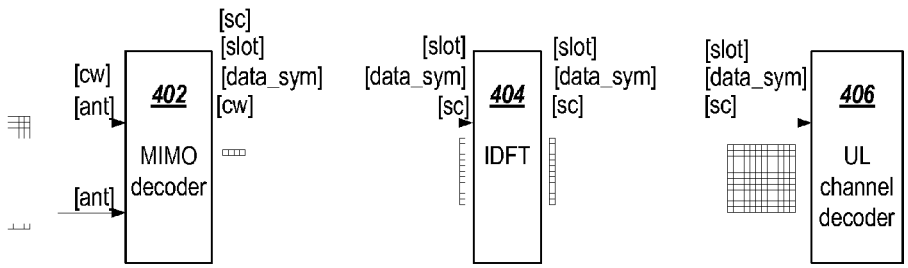
Figures 3, 9:
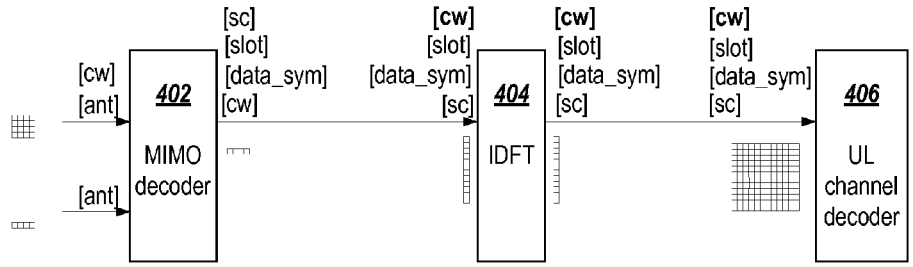
Figures 4, 9:
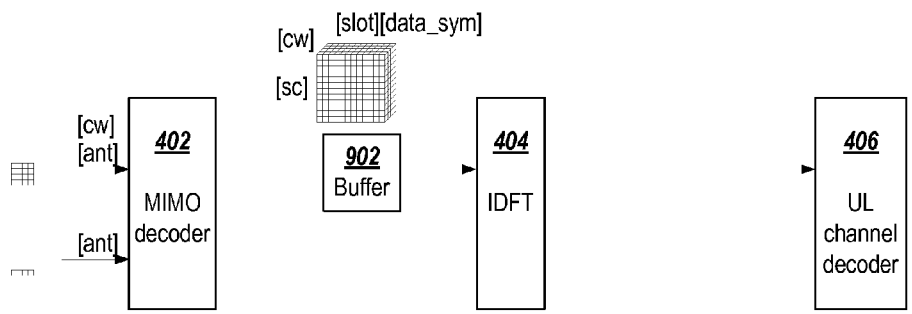

As described above, the buffer solutions generated may depend on the component ordering in which dimensions are supplemented from selected components to other components for the different scenarios. FIGS. 9-1 and 9-2 illustrate exchange of dimensions between components shown in FIG. 4 in a second order using the process shown in FIG. 7 to generate a second buffer solution. In this example, dimensions are supplemented from lists of dimensions in the component ordering {406, 404, and 402}. For ease of explanation and illustration, supplementation of dimensions of inputs to MIMO decoder 402 are not shown in FIGS. 9-1 through 9-4.

FIGS. 9-1 illustrates supplementing dimensions from the list of dimensions for the first component 406 in the component ordering {406, 404, 402} to the lists of dimensions for components 402 and 404. As a result, the lists of dimensions for components 402 and 404 are each supplemented with dimensions [sc], [slot], and [data_sym]. FIGS. 9-2 illustrates the supplementation of dimensions from the list of dimensions for the second component 404 in the component ordering {406, 404, and 402}. In this instance, the list of dimensions for component 404 does not include any dimensions that are not included in lists of dimensions for components 402 and 406. Therefore, the lists of dimensions are not supplemented from component 404. FIG. 9-3 illustrates the supplementation of dimensions from the list of the last component 402 in the component ordering {406, 404, and 402}. As a result, the lists of dimensions for components 404 and 406 are each supplemented with the dimension [cw].

FIGS. 9-4 illustrates generation of a set of buffers for the propagation scenario resulting from component ordering {406, 404, and 402} based on the supplemented lists of dimensions shown in FIGS. 9-3. As described above, dimensions located at the top of both lists are not required to be buffered. Similar to the solution shown in FIGS. 6-4, for connection 420, each of the dimensions must be buffered in buffer 902 because the first line in the lists of connected components 402 and 404 do not match. For connection 422, none of the dimensions need to be buffered because each of the lines in the lists of components 404 and 406 match.

While the exchange of dimensions between lists of dimensions is primarily described with reference to the processes shown in FIGS. 3 and 7, it is recognized that other processes for exchanging dimensions to produce the supplemented lists of dimensions may be used as well.

As indicated above, manual implementation of buffers for reformatting a data stream requires knowledge of data format requirements of each of the components in the signal processing design. However, documentation for IP core implemented sub-circuits may not be readily available or include the necessary format requirements. In one or more embodiments, a computer-assisted tool is configured to automatically determine data format requirements of the different components of a signal processor and generate buffer circuitry for data conversion between the circuit components.

For instance, in some embodiments, data ports of an IP core may be determined from metadata stored in the IP core. Metadata is associated with each component describing the dimensionality of the data on its input and output interfaces. The meta-data is defined once, by the core developer, and is stored in a library of IP. By formally defining the interfaces on the components the time-consuming and error prone task of extracting this data from a textual or graphical description in the datasheet is avoided. For example, using data port definitions retrieved from the meta-data and using a mapping of the circuit design between the data port and variables of the circuit design, dimensions of a data stream used by the IP core can be determined. Alternatively, in some embodiments, the data ports of an IP-core may be retrieved from an offline or online database provided by a distributor of the IP-core.

It is understood that input and output data formats may not be defined for all components of a circuit design. For example, a designer may include one or more custom designed components that interoperate with components implemented with IP cores. In one or more embodiments, the design tool may be configured and arranged to assist in the definition of a custom component based on dimensions of a data stream used by components for which the utilized dimensions have been determined. In one or more embodiments, suggested dimensions for a custom component may be determined from an identified buffer solution for components implemented with IP-cores. For instance, dimensions of a customized component and components connected thereto can be exchanged as described above to determine dimensions required by the adjacent components for the buffer solution. Based on such determination of dimensions, the design tool can automatically determine a set of recommended dimensions for the custom component that will require a least amount of additional buffering. The recommended dimensions may be displayed to a designer to assist in defining the custom component. In some implementations, the design tool may provide an interface for the designer to review and modify the recommended dimensions to define a set of dimensions for the custom component. In some embodiments, the design tool may provide an interface for the designer to specify a minimum set of dimensions that are to be defined for the custom component. Such a minimum set of dimensions may be specified initially before buffer solutions are determined or after a recommended buffer solution is displayed to the designer. In some embodiments, in response to the designer indicating modifications of the recommended set of dimensions or specifying the minimum set of dimensions, the design tool is configured to recalculate a new best buffer solution that takes the designers modifications and/or indicated minimum set of dimensions into account.

Figure 10:
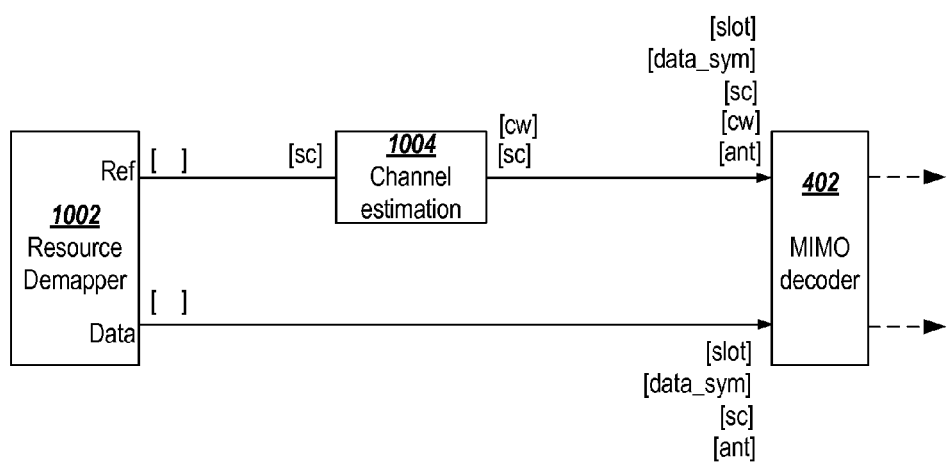
FIG. 10 shows an example circuit that may precede the circuit shown in FIG. 4 in an LTE system.

An example of determining recommended dimensions for a custom component is illustrated with respect to FIG. 10. FIG. 10 shows an example circuit that may precede the circuit shown in FIG. 4 in an LTE system. Channel estimation component 1004 generates channel and noise estimates for the MIMO decoder component 402 shown in FIG. 4. Resource demapper 1002 is configured to read data from a multi-dimensional data block and output data from two interfaces: one for reference symbols (which are processed by the channel estimation component 1004 and one for data symbols (which are input to MIMO decoder 402). For ease of explanation, dimensions of the supplemented list of MIMO decoder 402 in FIGS. 9-2 are presumed to be a fixed constraint of the MIMO decoder 402 in FIG. 10. In this illustrative example, channel estimation component 1004 is implemented by an IP core defined to operate on the [sc] and [cw] dimensions and the resource demapper 1002 is a custom user designed component that does not have output data stream dimensions defined. Because the resource demapper 1002 is a custom component block, the dimensions on the output interfaces are not pre-defined. Rather, these are defined by a designer of the system and dictate how the resource demapper is thereafter implemented. The exchange of dimensions between the interconnected components, as described above, can be used to automatically define the data format of a custom component like resource demapper 1002. For instance, the data output of resource demapper 1002 can be defined to have the same data format as the connected input of the MIMO decoder 402.

However, if reference (ref) output of resource demapper 1002 is defined to use a data format having the list of the dimensions of the input of the MIMO decoder 402, the resource demapper 1002 will be configured to use the [data_sym] dimension. This causes difficulty because the MIMO decoder 402 requires one estimate from the channel estimation per data symbol, and thus the channel estimation component 1004 must produce a channel estimate for each data symbol, and the resource demapper must produce a reference symbol for each data symbol. One way to handle this is to implement the resource demapper 1002 to replicate the reference symbol data. However, this approach requires channel estimates to be unnecessarily calculated repeatedly by the channel estimation component 1004 for the same reference symbol data.

Figure 11:
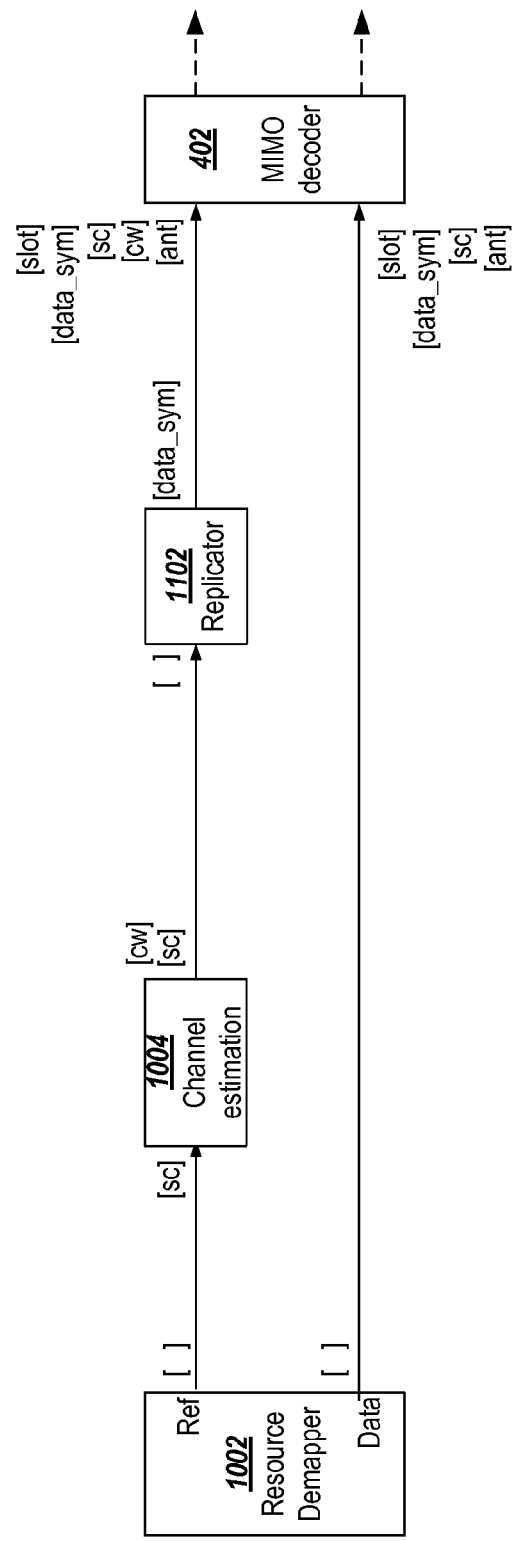
FIGS. 11 and 12 illustrate an additional modification to the circuit shown in FIG. 10 that may be performed by a design tool to avoid unnecessary processing.
Figure 12:
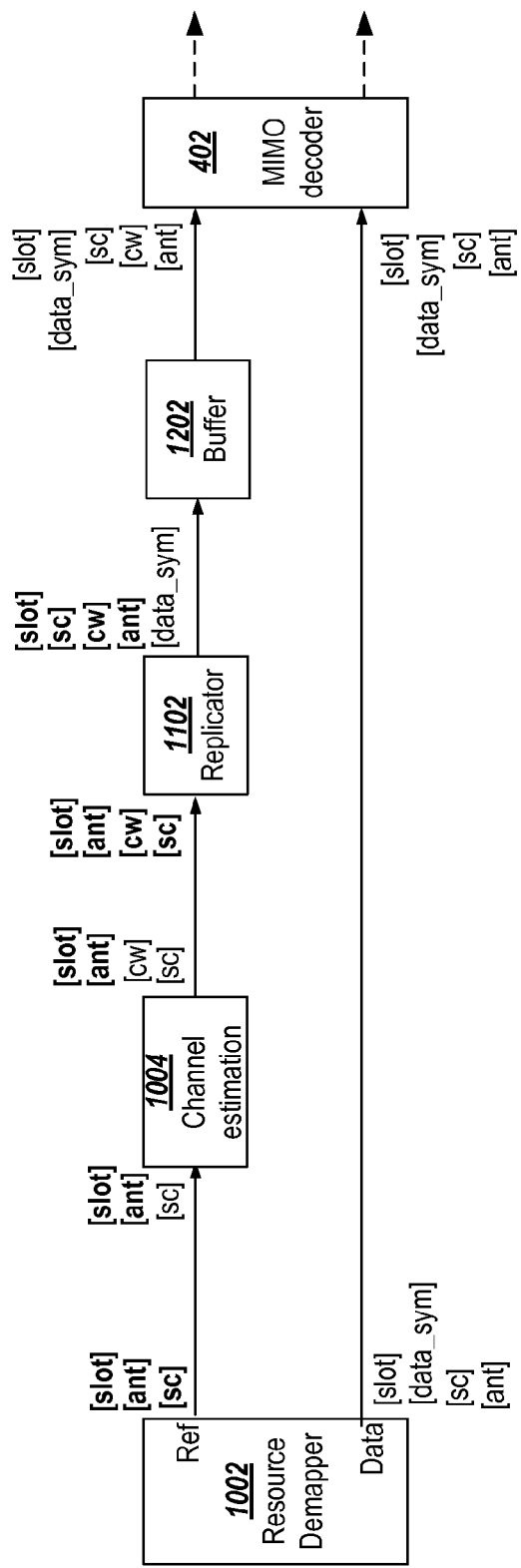

FIG. 11 illustrates a modification to the circuit shown in FIG. 10 that avoids unnecessary calculation of the channel estimation component 1004. The unnecessary calculation of the channel estimation component 1004 is avoided by providing a replicator block after the channel estimation component to provide the [data_sym] dimension used by the MIMO decoder 402. The replicator block 1102 consumes a single element and produces copies of that element for each data symbol. However, because the replicator block and the other components operate on different dimensions of the data stream additional buffering is required. Suitable buffers may be generated using the processes described above. FIG. 12 shows the circuit of FIG. 11, with buffers 1202 generated using supplemented lists of dimensions as described in the above processes. As in the above figures, dimensions added to each list of dimensions are indicated in bold. In this example, buffer 1202 is required to buffer dimensions [sc] [cw], [ant], and [data_sym] between replicator block 1102 and MIMO decoder 402. In one or more embodiments, a design tool is configured to insert a replicator block to avoid replication of calculations in earlier components in the data flow. In some implementations insertion may be performed automatically by adding constraints to the dimensions of the ref output of the resource demapper 1002 that may be reordered. In another implementation, a design tool is configured to provide an interface that allows a designer to select a connection and insert a replicator circuit (e.g., 1102).

Figure 13:
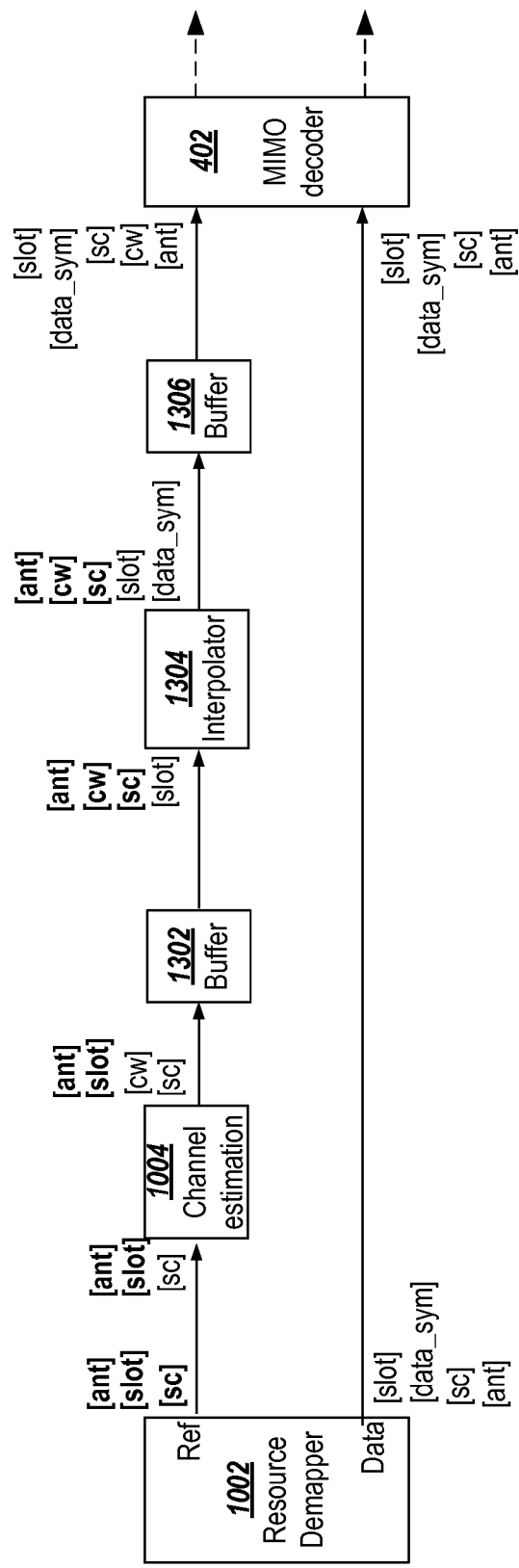
FIG. 13 illustrates another modification to the circuit shown in FIG. 10 that may be performed by a design tool to avoid unnecessary processing.

FIG. 13 illustrates another modification to the circuit shown in FIG. 10 that may be performed by a design tool to replicate the reference symbol data while avoiding unnecessary calculation of the channel estimation component 1004. In this example, channel estimates are interpolated between data slots of the data stream. To perform interpolation an interpolator block 1304 (having defined data type [slot]-> [slot][data_sym]) is added between the channel estimation component 1004 and the MIMO decoder 402. To match dimensions of the data stream used by the interpolator block 1304, the channel estimation component 1004, and the MIMO decoder 402, lists of dimensions used by each component are generated, supplemented, and used to generate buffers 1302 and 1306 using, e.g., the process described in FIG. 1.

Figure 14:
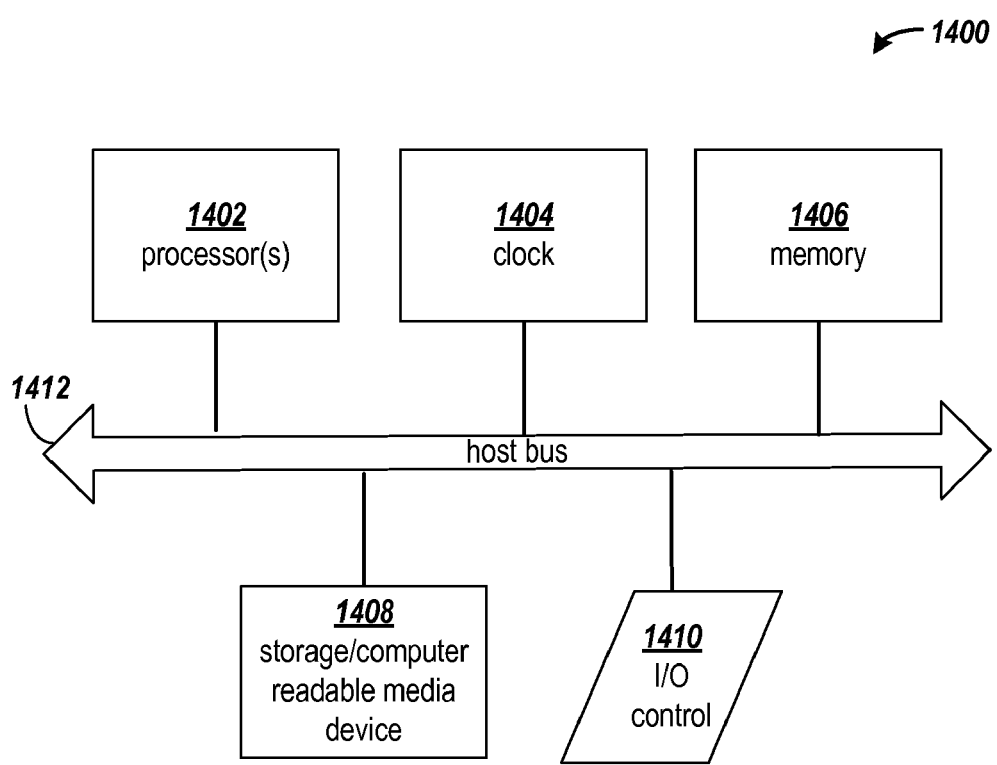
FIG. 14 illustrates a block diagram of a computing arrangement on which several processes described herein may be implemented.

FIG. 14 shows a block diagram of an example computing arrangement that may be configured to implement the processes and functions described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Although the embodiments are primarily described and illustrated with reference to buffering between components of a circuit design specification, the embodiments are not so limited. For instance, it is recognized that the embodiments could also be applied to buffering between different software components that are implemented in software. For such applications, the sets of buffers describe herein represents data conversions between the software modules. Because memory would be required to perform data conversions between the software modules, configuration of data conversions using one or more of the embodiments could assist to reduce the amount of memory required by the software application.

Processor computing arrangement 1400 includes one or more processors 1402, a clock signal generator 1404, a memory unit 1406, a storage unit 1408, and an input/output control unit 1410 coupled to a host bus 1412. The arrangement 1400 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 1402 may be one or more general-purpose processors, or a combination of one or more general-purpose processors and suitable co-processors, or one or more specialized processors (e.g., RISC, CISC, pipelined, etc.).

The memory arrangement 1406 typically includes multiple levels of cache memory, and a main memory. The storage arrangement 1408 may include local and/or remote persistent storage such as provided by magnetic disks (not shown), flash, EPROM, or other non-volatile data storage. The storage unit may be read or read/write capable. Further, the memory 1406 and storage 1408 may be combined in a single arrangement.

The processor arrangement 1402 executes the software in storage 1408 and/or memory 1406 arrangements, reads data from and stores data to the storage 1408 and/or memory 1406 arrangements, and communicates with external devices through the input/output control arrangement 1410. These functions are synchronized by the clock signal generator 1404. The resource of the computing arrangement may be managed by either an operating system (not shown), or a hardware control unit (not shown).

The disclosed embodiments are thought to be applicable to a variety of applications and tools related to circuit design and electronic circuitry. Other aspects and embodiments will be apparent to those skilled in the art from consideration of the specification. It is intended that the specification and illustrated embodiments be considered as examples only, with a true scope and spirit of the invention being indicated by the following claims.

What is claimed is:

1. A method, comprising:
   receiving a circuit design having a plurality of components, each component having a data terminal connected to a data terminal of another one of the components;
   for each of the data terminals, determining a respective list of dimensions of data used by the data terminal; and
   performing on at least one programmed processor, operations including:

generating a plurality of exchange orderings, each exchange ordering indicating an order in which dimensions are exchanged between the lists of dimensions;

for each exchange ordering:
exchanging dimensions between the lists in the order indicated by the exchange ordering to produce a set of supplemented lists of dimensions;
determining a set of buffers for buffering data between connected ones of the data terminals based on the supplemented lists of dimensions; and
determining memory requirements for the set of buffers corresponding to each exchange ordering; and modifying the circuit design to include the one of the determined sets of buffers having a lowest memory requirement.

2. The method of claim 1, wherein each of the plurality of exchange orderings indicates an order in which dimensions are exchanged between pairs of connected ones of the plurality of components to supplement the lists of dimensions.

3. The method of claim 2, wherein exchanging dimensions between the lists in the order indicated by the exchange ordering is repeated until each of the lists includes every dimension included in another one of the lists.

4. The method of claim 1, wherein:
each exchange ordering indicates an order of a list of the plurality of components; and
the exchanging dimensions between the lists of dimensions in the order indicated by the exchange ordering to produce the set of supplemented lists of dimensions includes, for each of a plurality of different orderings of a list of the plurality of components:
for each one of the plurality of components in the order of the list of the plurality of components, supplementing the respective lists of dimensions of other ones of the components with the list of dimensions of the one of the components to produce the supplemented lists of dimensions.

5. The method of claim 4, wherein the supplementing the respective list of dimensions of another one of the components with the list of dimensions of the one of the components includes:
for each dimension in the list of dimensions of the one of the components, in response to the dimension not being included in the list of dimensions corresponding to the other one of the components, adding the dimension to said list of dimensions corresponding to the other one of the components.

6. The method of claim 5, wherein the adding the dimension to the list of dimensions includes, adding the dimension to the front of the list of dimensions.

7. The method of claim 6, wherein the determining the set of buffers for buffering data between connected ones of the data terminals includes, for each connection between the data terminals, determining a respective additional set of dimensions including a first list of dimensions, corresponding to a first one of the data terminals at a first end of the connection, that appear in a different order than in a second list of dimensions, corresponding to a second one of the data terminals at a second end of the connection.

8. The method of claim 7, wherein the determination of memory requirements for the respective set of buffers includes:
for each of the respective additional sets of dimensions:
determining a cardinality of each dimension in the additional set of dimensions; and determining a respective product of the cardinalities of the dimensions in the additional set of dimensions; and
determining a sum of each of the determined products.

9. The method of claim 1, wherein:
at least one of the plurality of components in the circuit design is described by an IP-Core; and
the determination of the respective list of dimensions of data used by the data terminal of the at least one of the components includes retrieving meta data from the IP-Core that indicates dimensions of the IP core.

10. The method of claim 1, wherein the plurality of components are connected in series.

11. A method, comprising:
receiving a specification having a plurality of components, each component having a data terminal connected to a data terminal of another one of the components;
for each of the data terminals, determining a respective list of dimensions of data used by the data terminal;
performing on at least one programmed processor, operations including:
generating a plurality of propagation scenarios, each propagation scenario indicating a set of supplemented lists resulting from a respective exchange of dimensions between the lists of dimensions such that each supplemented list in the set includes every dimension included in the lists of dimensions, the respective exchange of dimensions for each propagation scenario having a different order than the exchanges of scenarios corresponding to other ones of the plurality of propagation scenarios;
for each propagation scenario, determining a respective set of buffers for buffering data between connected ones of the data terminals based on the corresponding supplemented list of dimensions;
determining memory requirements for each of the set of buffers corresponding to each exchange ordering; and
modifying the specification to include the one of the determined sets of buffers having a lowest memory requirement.

12. The method of claim 11, wherein the generation of the plurality of propagation scenarios includes:
for each of the plurality of propagation scenarios, generating a respective exchange ordering, each of the exchange orderings indicating a different order in which dimensions are exchanged between the lists; and
for each exchange ordering, exchanging dimensions between the lists of dimensions in the order indicated by the exchange ordering to produce the set of supplemented lists of dimensions of the corresponding propagation scenario.

13. The method of claim 12, wherein:
each of the exchange orderings indicates an order in which dimensions are exchanged between pairs of connected ones of the plurality of components to produce the corresponding set of supplemented lists of dimensions; and
the exchanging of dimensions between the lists in the order indicated by the exchange ordering is repeated until each of the lists includes every dimension included in the lists of dimensions.

14. The method of claim 12, wherein:
each exchange ordering indicates a respective order of a list of the plurality of components;
the exchanging of the dimensions between the lists of dimensions in the order indicated by the exchange ordering to produce the set of supplemented lists of dimensions of the corresponding propagation scenario includes:
    for each one of the plurality of components in the respective order of the list of the plurality of components, supplementing the respective lists of dimensions of other ones of the components with the list of dimensions of the one of the components to produce the supplemented lists of dimensions; and
the supplementation of the respective list of dimensions of another one of the components with the list of dimensions of the one of the components includes:
    for each dimension in the list of dimensions of the one of the components, in response to the dimension not being included in the list of dimensions corresponding to the other one of the components, adding the dimension to said list of dimensions corresponding to the other one of the components.

15. The method of claim 12, wherein:
the exchanging of dimensions between the lists of dimensions in the order indicated by the exchange ordering to produce the set of supplemented lists adds dimensions to the front of the lists of dimensions according to the exchange ordering; and
the determination of the respective set of buffers for buffering data between connected ones of the data terminals based on the corresponding supplemented list of dimensions, of the set of buffers for buffering data between connected ones of the data terminals includes:
    for each connection between the data terminals, determining a respective additional set of dimensions including a first list of dimensions, corresponding to a first one of the data terminals at a first end of the connection, that appear in a different order than in a second list of dimensions, corresponding to a second one of the data terminals at a second end of the connection.

16. The method of claim 11, wherein:
at least one of the plurality of components in the specification is a custom defined component; and further comprising:
in response to determining the set of buffers having the lowest memory requirement, displaying a set of dimensions for the custom designed component based on the set of buffers having the lowest memory requirement.

17. The method of claim 11, further comprising:
identifying at least one component of the plurality of components in which redundant processing is performed for one or more dimensions included in a buffer preceding the at least one component in the plurality of components; and
modifying the specification to include a circuit after the at least one component to replicate data for the one or more dimensions.

* * * * *